United States Patent [19]

Knobloch et al.

[11] 4,128,870
[45] Dec. 5, 1978

[54] HIGH CURRENT-RECTIFIER ARRANGEMENT

[75] Inventors: Johannes F. Knobloch, Watt-Regensdorf; Ernst Brunner, Zürich, both of Switzerland

[73] Assignee: H.A. Schlatter AG, Schlieren, Switzerland

[21] Appl. No.: 831,086

[22] Filed: Sep. 6, 1977

[30] Foreign Application Priority Data

Sep. 29, 1976 [CH] Switzerland .................. 12295/76

[51] Int. Cl.$^2$ ............................................. H02M 7/06
[52] U.S. Cl. .................................... 363/141; 363/144; 357/79
[58] Field of Search .................... 357/76, 79, 81, 82; 363/141, 144, 146

[56] References Cited

U.S. PATENT DOCUMENTS

| | | | |
|---|---|---|---|
| 3,471,757 | 10/1969 | Sias | 357/76 X |
| 3,559,001 | 1/1971 | Cooper et al. | 357/79 |
| 3,652,903 | 3/1972 | Eriksson et al. | 357/76 |
| 3,723,836 | 3/1973 | Shekerjian et al. | 357/79 X |
| 3,727,114 | 4/1973 | Oshima | 357/79 |
| 3,940,787 | 2/1976 | Juchmann | 357/79 X |
| 4,015,184 | 3/1977 | Cooperman | 363/141 |
| 4,080,645 | 3/1978 | Schilling et al. | 357/76 X |

*Primary Examiner*—William M. Shoop
*Attorney, Agent, or Firm*—Werner W. Kleeman

[57] ABSTRACT

A high current-rectifier arrangement comprising a movable contact body which is of substantially piston-like structure and arranged with radial play in a cylinder-like compartment or chamber formed in an associated contact element and surrounded at its periphery by a connection line which bridges the radial play to the inner wall of the compartment. Furthermore, cooling agent-channel means of such contact body are arranged in offset relationship at the periphery thereof with respect to the connection line and sealingly connected with cooling agent-channels provided in the connection element.

9 Claims, 6 Drawing Figures

HIGH CURRENT-RECTIFIER ARRANGEMENT

BACKGROUND OF THE INVENTION

The present invention relates to a new and improved construction of high current-rectifier arrangement which is of the type comprising at least one semiconductor-rectifier element possessing contact surfaces, wherein the contact surfaces are fixedly clamped between contact bodies equipped with cooling agent-channel means, one of the contact bodies being movable and prebiased by means of spring force against the other contact body and electrically coupled by a deformable connection line or conductor with an associated connection element.

Preferred fields of application of such high current-rectifier arrangements employing the nowadays commercially available, semiconductor-rectifier elements with their very high, permissible rated currents, but comparitively low operating voltages, are, by way of example, electrolysis or heating owing to electrical power dissipation.

It is of course true that the high rated currents and their side effects demand the fulfillment of certain constructional requirements which cannot be easily satisfied. The semiconductor-rectifier element should be clamped or fixedly held between the contact bodies and these contact bodies are assigned different functions. For one thing, they must be capable of ensuring for a faultless electrical contact with low transfer or transition resistance to the rectifier element, such transition resistance must be capable of handling current intensities in the order of magnitude of many kA. Secondly, the contact bodies — in order to ensure for the requisite contact — must be capable of taking-up clamping forces and transmitting the same, such clamping forces should experience as small as possible change due to the unavoidable thermal expansions and the manufacturing tolerances of the different components as well as the magnetic forces prevailing therebetween. Thirdly, the contact bodies must be able to remove the unavoidable heat losses which are present under load. Furthermore, the entire construction of the rectifier must be as compact as possible, in order to provide small current paths and thus to maintain the impedance as small as possible. That the optimum fulfillment of all of these requirements is associated with great difficulties, is already manifested by the fact that due to the very high current intensities all of the conductive connections must possess quite considerable cross-sectional areas, and furthermore, as a general rule must be of massive construction.

With a heretofore know prior art rectifier arrangement of the previously mentioned type the deformable connection line or conductor consists of a connection bracket formed of copper sheet of several millimeters thickness. This connection bracket is fixedly screwed flat at one end upon the end face of the associated contact body, laterally protrudes therefrom and at the other end is flatly screwed directly with the end of the secondary winding of a transformer constructed as a connection element. The spring pressure acting upon the contact body is accomplished by a package of plate springs which act directly upon the contact body approximately at the center thereof. At the end of the connection bracket associated with the contact body there is thus machined-out an eyelet for the throughpassage of the plate springs. The free path of the connection bracket between its fixedly threaded or screwed ends can bend-through in order to compensate for the unavoidable manufacturing tolerances, but also to take-up movements which are brought about by the thermal expansion during operation. In the case of the appreciable cross-sectional area of the connection bracket, which is dictated by the rated current, there is required a force which cannot be considered to be negligible in order to bend-through such connection bracket. This force produces an undesired non-symmetry in the prebias emanating from the plate springs and acting upon the contact body, with the result that the contact pressure thereof acting upon the rectifier element and along therewith the transfer or transition resistance are irregularly divided over the contact surface. While it would be technically possible to provide a great bendability of the connection bracket, such only could be achieved at the expense of the compact construction of the system and while further taking into account an extension of the current path.

SUMMARY OF THE INVENTION

Hence, it is a primary object of the present invention to provide a new and improved construction of a high current-rectifier arrangement which is not associated with the aforementioned drawbacks and limitations of the prior art proposals.

Another and more specific object of the present invention aims at the provision of a new and improved construction of a high current-rectifier arrangement of the previously mentioned type which is designed in such a manner that at the one contact body the application of the clamping force, the current transfer to the connection line and the dissipation of the thermal losses at different localities and by elements which are mutually spaced from one another, is accomplished in such a manner that these three different functions do not antagonistically influence one another.

Now in order to implement these and still further objects of the invention, which will become more readily apparent as the description proceeds, the proposed high current-rectifier arrangement of the previously mentioned type is manifested by the features that the movable contact body is constructed in a piston-like manner and is arranged with radial play in a cylinder-like compartment or chamber formed in the associated connection element and at its periphery is surrounded by the connection conductor or line which bridges the radial play to the inner wall of the compartment. Further, the cooling agent-channel means of such contact body is likewise formed at its periphery however offset with regard to the connection line and is sealingly connected with cooling agent-channels provided in the connection element.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
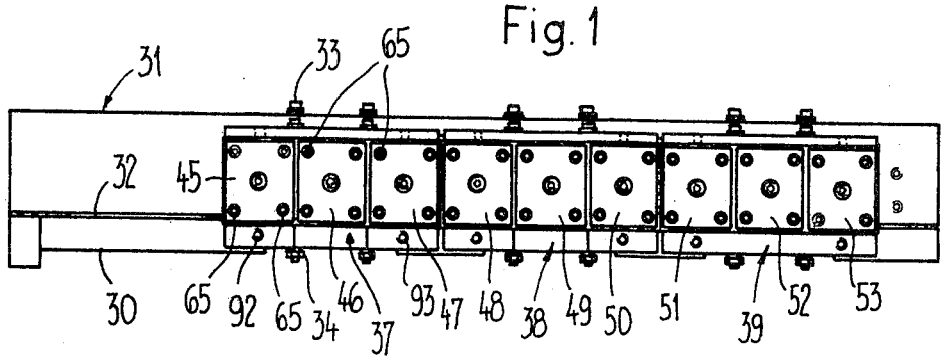
FIG. 1 is a side view of a high current-rectifier arrangement constructed according to the teachings of the present invention.
Figure 2:
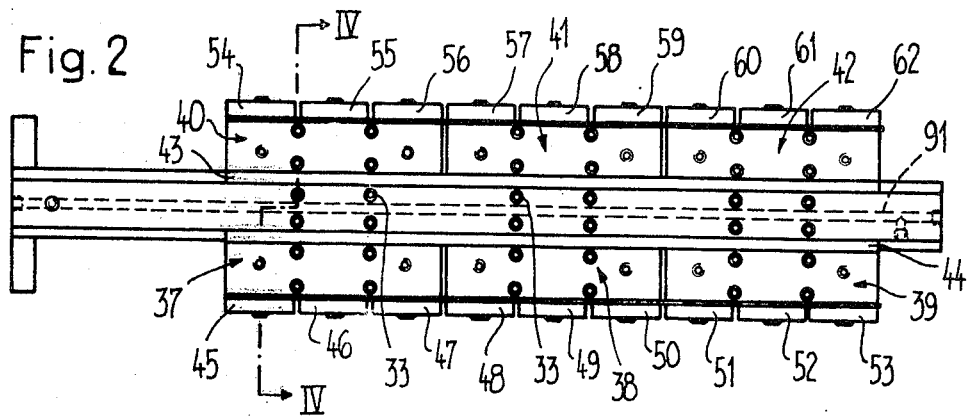
FIG. 2 is a top plan view of the rectifier arrangement of FIG. 1.
Figure 3:
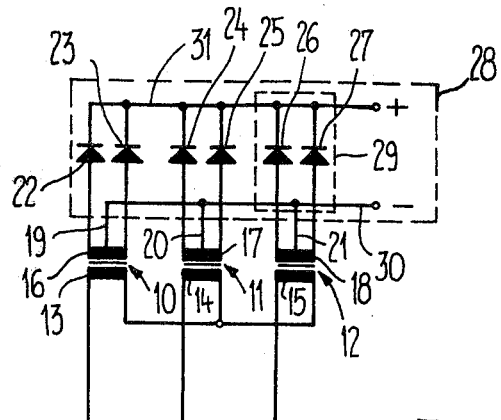
FIG. 3 is a circuit diagram of the rectifier arrangement shown in FIGS. 1 and 2.
Figure 4:
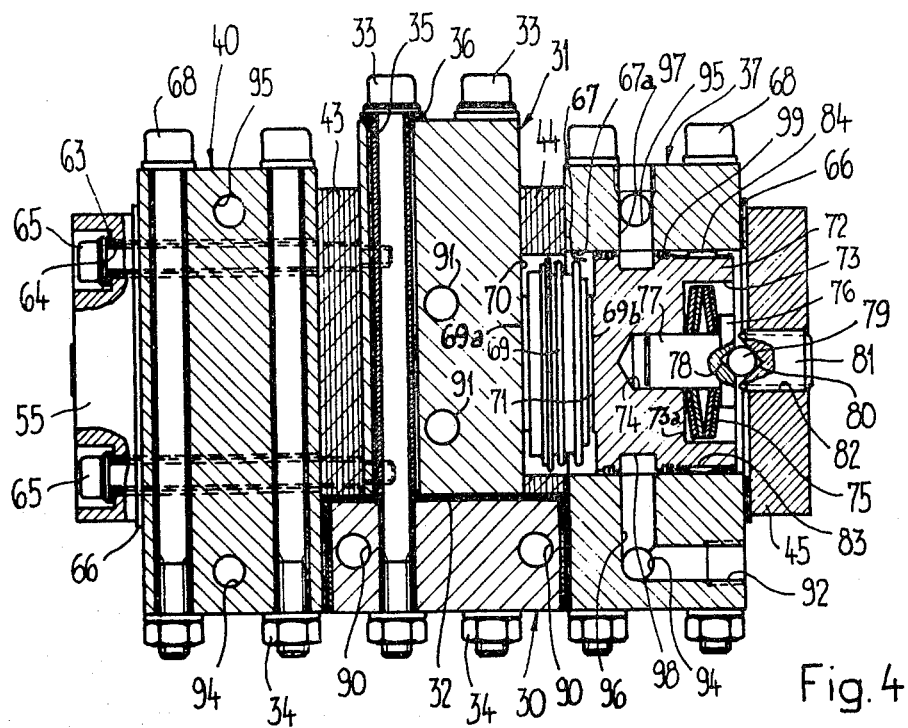
FIG. 4 is a sectional view, on an enlarged scale, taken substantially along the line IV—IV of FIG. 2.

Before undertaking in detail the description of FIGS. 1, 2 and 4, it will be useful to first consider the circuitry of FIG. 3 in which there is employed the illustrated rectifier or rectifier arrangement. Three single-phase transformers 10, 11 and 12, having magnetically separated circuits, are connected at their primary windings 13, 14, and 15 respectively, in a star or Y-connection with the three phases R, S, T of a three-phase power system. The secondary windings 16, 17, and 18 of the three single-phase transformers 10, 11 and 12 each possess a respective center tap 19, 20 and 21 which are interconnected with one another and electrically coupled with the one rail or bar 30 forming the negative- or ground terminal of the rectifier. The ends of the secondary windings 16 to 18 are each connected through the intermediary of rectifier devices 22 to 27, illustrated for the sake of simplicity as diodes, at a rail or bar 31 forming the other terminal, in this case the positive terminal, of the rectifier or rectifier arrangement. What has been enclosed within the box shown by broken lines 28 in FIG. 3, is illustrated in detail in FIGS. 1 and 2, whereas FIG. 4 in principle portrays a part of the arrangement shown in FIG. 3 enclosed within the box formed by the broken lines 29. It is here to be observed that with the illustrated rectifier arrangement the construction of all of the rectifier devices or units 22 to 27 is in principle the same, and each rectifier device can encompass one or more parallelly connected semiconductor-rectifier elements. Therefore, it should be sufficient for the purposes of this disclosure if there is considered in detail in the description to follow one of such rectifier devices or units based upon one of its rectifier elements.

Turning attention now to FIGS. 1, 2 and 4 there will be recognized the rails 30 and 31 which, while interposing an insulating layer 32, are threadably connected with one another by means of sturdy bolts 33 and nut members 34 or equivalent structure to a rigid T-section or profile member. As will be clearly evident from the showing of FIG. 4, the bolts 33 or equivalent structure are electrically insulated by means of an insulating sleeve 35 and insulating underlay discs 36 from the rail or bar 31, whereas the rail 30 which is at ground potential is not insulated from the bolts 33 and nut members 34 or the like. While not particularly shown in the drawings, the bolts 33 also serve the purpose of flanging the rail 30 directly to the center taps 19, 20 and 21, each leading out of the secondary windings 16, 17 and 18 in the form of a respective connection plate.

Now to both sides of the rail 31 there are attached thereto three respective substantially block-shaped, rather massive connection elements 37 to 39 and 40 to 42 while interposing a respective insulating intermediate plate 43 and 44. Such connection or attachment is accomplished for each of the connection elements 37 to 39 and 40 to 42 by means of three covers or cover members 45 to 47, 48 to 50, 51 to 53, 54 to 56, 57 to 59 and 60 to 62, respectively, which, in turn, are fixedly threadably connected each by means of four bolts 65 which are insulated from the related or associated covers and blocks by means of an insulating underlay disc or plate 63 and an insulating sleeve 64. These bolts 65 engage through the intermediate plates 43, 44 and are fixedly threadably connected into the flanks or flanges of the rail 31. Each rectangular configured cover 45 to 62 is electrically insulated from the associated connection element by means of an insulating intermediate layer 66 and closes a substantially cylindrical or cylinder-shaped chamber or compartment 67 which is formed in the related connection element or piece and extends through the insulating intermediate plates 43 and 44 respectively. Each of the connection elements or pieces 37 to 39 and 40 to 42, in the illustrated exemplary embodiment under discussion, will be seen to comprise three identically formed chambers or compartments 67, but for the sake of simplicity in the showing FIG. 4 only shows one such chamber or compartment 67 at the right-hand side thereof. The connection elements 37 to 39 and 40 to 42 together with the side surfaces which are coplanar with the flat side of the rail 30 as shown at the lower portion of FIG. 4, serve as a contact block for the ends of the secondary windings 16 to 18 of the transformers 10 to 12, these ends being constructed as not particularly shown closure or connection plates. In order to threadably connect the connection elements 37 to 42 with the associated connection plates of the secondary winding there are employed the bolts 68 or equivalent structure, which extend through the blocks and in FIG. 4 are provided with the not particularly referenced nut members.

Each of the chambers or compartments 67 serves for the reception of a high current-semiconductor-rectifier element 69, for instance in that form which it is commercially available on the market, namely in the form of a completely encapsulated disc or annular plate or disc, the flat sides of which form the contact surfaces.

The one flat end face or side 69a of the rectifier element 69, as shown in FIG. 4, snugly bears against the one confronting flat or planar flank or side 70 of the rail 31 which thus serves as a contact body. This flank or side 70, in this instance, then advantageously constitutes a reference surface for all rectifier elements arranged at this side of the rail 31. The same analogously holds true for the total of, for instance, nine rectifier elements, accommodated at the connection elements 40, 41 and 42, with regard to the oppositely situated flank or side of the rail 31. At the other flat end face 69b of the illustrated rectifier element 69 there snugly bears the end surface 71 of a contact body 72 constructed as a piston which is arranged with radial play in the chamber or compartment 67. At the side of the contact body 72 which faces away from the rectifier element 69 there is formed therein a central spring chamber or compartment 73 and a guide bore 74 arranged essentially coaxially thereto. Located in the spring chamber 73 is a package of plate springs 75, bearing at one end upon the floor or base 73a of such spring chamber 73 and at the other end against a head member 76 of a bolt 77 displaceably guided within the guide bore 74. Seated within a conical bore 78 in the head or head member 76 is a ball 79 which, in turn, is supported in a conical bore 80 at the end of an adjustment or setting screw 81 or equivalent structure. This adjustment screw 81 is threaded into a threaded bore 82 formed at the central region or center of the cover 45. By virtue of the foregoing description it should be apparent that the contact body 72, as a function of the depth of screwing-in of the adjustment of setting screw 81, is pressed against the rectifier element 69, and furthermore, as a function of the play between its not particularly referenced periphery and the inner wall 67a of the chamber or compartment 67 is capable of wobbling, in order to thereby compensate for alignment errors of the flat sides of the rectifier element 69 and also any thickness tolerances thereof. In this manner there is fulfilled one of the constructional requirements, namely that of providing a suitable, mechanical clamping force which is uniformly exerted upon the rectifier element 69.

Now it is also possible to produce a faultless and high-loadable electrical contact between the contact body 72 and the connection element 37. For this purpose there is provided at the periphery of the contact body 72 a flat groove 83 which opens towards the outside and into which there is inserted a laminated contact ring 84 which bridges the play between the contact body 72 and the inner wall of the chamber or compartment 67.

Figure 5:
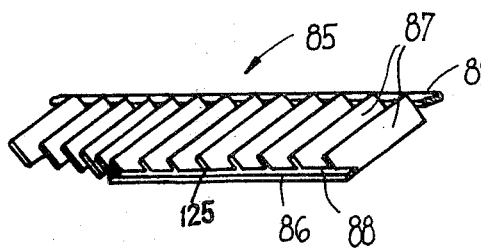
FIG. 5 is a perspective view of a piece of the deformable connection line used in the arrangement of FIG. 4 and shown in its flexed or angled state.

The contact ring 84 is bent-out of a contact band 85, a portion of which has been shown in FIG. 5. Such laminated contact rings are commercially available on the market. As can be best seen by referring to FIG. 5, the contact band 85 comprises a sheet metal or plate band 86 from which there are cut-out, by means of a series of substantially I-shaped cuts a sequence of lamellae or tabs 87 extending transverse to the direction of the band 86. These lamellae or tabs 87, in turn, are individually turned out of the plane of the band 86 through an angle in the order of about 40° to 45°. The ends of the lamellae 87 however remain effectively connected with the lateral edges 88 and 89 of the band 86 by means of a web, generally indicated by referenced character 125, which acts as a torsion spring. The contact band 85 is preferably fabricated from an electrically good conductive material having spring characteristics, for instance of Be-bronze (beryllium-bronze), and preferably surface-treated, for instance silver- or gold-plated. In the installed condition the lamellae or tabs 87 of the band 85 which are bent-up with regard to the ring 84, are somewhat resiliently turned back, thus dig or claw into both the floor or base of the groove 83 and therefore also into the contact body 72, as well as also dig or claw into the inner wall 67a of the chamber or compartment 67 and thus into the connection element or piece 37. Since the lamellae 87 contact the chamber or compartment 67 along generatrixes or surface lines thereof, the axial mobility of the contact body 72 within the chamber 67 is insured for, even if such must be accomplished while overcoming a frictional engagement. However, it is to be observed that the frictional forces which are effective in the axial direction are uniformly distributed about the axis of the contact body 72, and thus, do not produce any non-symmetry as concerns the contact force. Also the electrical contact is faultless and the transfer resistance is at a minimum, yet the current flows transversely through each individual lamella, the active transfer cross-section of which practically corresponds to the product of the length of the lamella and the thickness of the band. Finally, the contact ring 84 is also readily compressible in its radial thickness, since the lamellae 87, as already mentioned, can be resiliently turned-back in the plane of the band.

Hence, in this way there is also complied with a second requirement, namely that of a faultless electrical contact between the contact body 72 and the connection element 37 without appreciably impairing the means which produce the contact force.

In order to remove the practically unavoidable thermal or heat losses there are formed both in the rail 30 as well as also in the rail 31 cooling agent channels 90 and 91, respectively, which are connected in conventional and therefore not further particularly shown manner with a circulation system for a suitable cooling agent.

Also as best seen by referring to FIG. 4, in the connection elements 37 to 42 there are provided cooling agent channels 94, 95 which can be connected via the nipple bores 92, 93 (FIG. 4) to a likewise not particularly illustrated but standard cooling agent-recirculation system. These cooling agent channels 94, 95 are in flow communication via radial bores 96, 97 with the chamber or compartment 67 and with an outwardly opening groove 98 which is formed at the periphery of the contact body 72. The groove 98 is sealed by the seals or sealing means 99 which bridge the play between the contact body 72 and the inner wall 67a of the chamber 67. It is to be observed that the groove 98, conducting the cooling agent, which may be for instance water or any other suitable coolant, is arranged between the end surface 71 of the contact body 72, i.e., the contact surface 69b of the rectifier element 69 and the contact ring 84. The heat which is produced at the end surface 71, i.e., the heat which is taken-up or absorbed thereby is thus extensively withdrawn by the cooling agent flowing in the groove 98, before it can affect the contact locations of the contact ring 84. Conversely, the heat which is present also at such contact locations — to the extent that it is not removed by the cooling agent in the channels 95 — is withdrawn by the cooling agent in the groove 98, before it is capable of appreciably influencing the temperature of the end surface 71. In this way there is also fulfilled the third requirement, namely that of withdrawing the thermal losses in a faultless manner.

In summation, it therefore can be stated that the withdrawal of heat and the current flow, viewed from the contact body 72 is distributed in radial direction and about the entire periphery thereof, but accomplished in different planes whereas only the clamping forces are axially applied, and furthermore, the means which serve for the removal of the heat and for transmitting the current as well as the clamping forces from and to the contact body 72 practically do not mutually influence one another.

Figure 6:
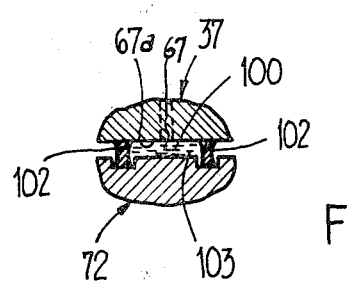
FIG. 6 is a cross-sectional detail of a variant construction wherein there is employed a connection line which is liquid during operation.

In the exemplary embodiment described in FIGS. 4 and 5 there is provided as the connection line or conductor beween the contact element 72 and the connection element 37 the laminated contact ring 84. This construction affords particular advantages owing to its simplicity. There has already been discussed the increased friction caused by the ring 84. This can be avoided if the electrical connection between the connection element 37 and the contact body 72 is constructed as schematically illustrated in FIG. 6. In this case an annular or ring-shaped chamber 100 between the periphery of the contact body 72 and the inner wall 67a of the chamber 67 is axially limited or bounded by two seals 102 which bridge the play between the contact body 72 and the inner wall 67a of the chamber 67. This annular or ring-spaced chamber 100 is filled with a low melting eutectic 103, for instance selected from the elements Be (beryllium), Sn (tin), Pb (lead), Cd (cadmium), Hg (mercury), In (indium), and Ga (gallium). Such eutectics are available which are liquidous at temperatures exceeding about 15° C., i.e., at approximately room temperature. In the liquid state such eutectics afford an extremely small transfer resistance and in the case under consideration produce no friction whatever. Such "liquid" connection line or conductor, in the case under discussion, is particularly advantageous, because the volume of the annular or ring-shaped chamber 100 is constant independent of the axial and the radial position of the contact body 72 in the chamber or compartment 67.

Whereas with the described exemplary embodiment the rectifier elements comprise diodes, it is to be expressly understood that also controlled rectifier elements can be employed, for instance controlled Si-rectifiers (silicon-rectifiers) with the proposed rectifier arrangement.

While there are shown and described present preferred embodiments of the invention, it is to be distinctly understood that the invention is not limited thereto, but may be otherwise variously embodied and practiced within the scope of the following claims. ACCORDINGLY,

What we claim is:

1. A high current-rectifier arrangement comprising:
   at least one semiconductor-rectifier element having contact surfaces;
   means including at least one contact body equipped with cooling agent-channel means and between which said semiconductor-rectifier element is fixedly clamped by means of its contact surfaces;
   means mounting said contact body to be movable;
   means for pre-biasing under spring force said movable contact body;
   said mounting means including a connection element;
   a connection line for electrically connecting the movable contact body with said connection element;
   said movable contact body possessing a substantially piston-like structure;
   said connection element being provided with a substantially cylinder-shaped compartment having an inner wall and within which there is movably arranged the piston-like, movable contact body with radial play;
   said movable contact body being surrounded at its periphery by said connection line which bridges the radial play to the inner wall of said compartment;
   said cooling agent-channel means of said movable contact body being constructed to be offset at the periphery thereof with regard to said connection line;
   said connection element being provided with cooling agent-channels; and
   means for sealingly connecting the cooling agent-channel means of said movable contact body with the cooling agent-channels of the connection element.

2. The rectifier arrangement as defined in claim 1, wherein:
   said movable contact body is mounted in said compartment for carrying out a limited wobble motion;
   a member stationary with respect to said connection element;
   plate spring means and ball-and-socket like bearing means for supporting said movable contact body at said stationary member.

3. The rectifier arrangement as defined in claim 2, wherein:
   said connection line comprises a laminated contact ring having lamellae;
   said lamellae engaging at the periphery of the contact body and at the inner wall of the cylinder-shaped compartment.

4. The rectifier arrangement as defined in claim 3, wherein:
   said lamellae engage both at the contact body and at the inner wall of the compartment along lines which extend essentially parallel to the line of action of the spring force exerted by said plate spring means.

5. The rectifier arrangement as defined in claim 2, wherein:
   said stationary member includes a cover for closing the end of the cylinder-shaped compartment which faces away from the rectifier element; and
   an adjustment screw forming part of the ball-and-socket like bearing means threaded into said cover.

6. The rectifier arrangement as defined in claim 1, wherein:
   said connection line comprises a low-melting eutectic;
   means defining a substantially ring-shaped chamber;
   seal means for separating said ring-shaped chamber between said contact body and said cylinder-shaped compartment; and
   said eutectic being located in said ring-shaped chamber.

7. The rectifier arrangement as defined in claim 1, wherein:
   said cooling agent-channel means of the movable contact body is arranged between an end thereof confronting the rectifier element and the connection line.

8. The rectifier arrangement as defined in claim 1, wherein:
   said cooling agent-channel means of the movable contact body comprises an annular groove which opens towards the outside and formed at the periphery of said movable contact body; and
   said annular groove being sealed to both sides by seal means with regard to the inner wall of said cylinder-shaped compartment.

9. A high current-rectifier arrangement comprising:
   at least one semiconductor-rectifier element having oppositely situated contact surfaces;
   at least one movable contact body equipped with cooling agent-channel means engaging with one of the contact surfaces of the semiconductor-rectifier element;
   means for biasing said movable contact body;
   a connection element;
   a connection line for electrically connecting the movable contact body with said connection element;
   said movable contact body possessing a substantially piston-like structure;
   said connection element being provided with a substantially cylinder-shaped compartment having an inner wall and within which there is movably arranged the piston-like, movable contact body with radial play;
   said movable contact body being enclosed at its periphery by said connection line which bridges the radial play to the inner wall of said compartment;
   said cooling agent-channel means of said movable contact body being constructed to be offset at the periphery thereof with regard to said connection line;
   said connection element being provided with at least one cooling agent-channel; and
   means for sealingly connecting the cooling agent-channel means of said movable contact body with the cooling agent-channel of the connection element.

* * * * *